(12) United States Patent
Farooq et al.

(10) Patent No.: US 8,129,256 B2
(45) Date of Patent: Mar. 6, 2012

(54) 3D INTEGRATED CIRCUIT DEVICE FABRICATION WITH PRECISELY CONTROLLABLE SUBSTRATE REMOVAL

(75) Inventors: Mukta G. Farooq, Hopewell Junction, NY (US); Robert Hannon, Wappingers Falls, NY (US); Subramanian S. Iyer, Mount Kisco, NY (US); Steven J. Koester, Ossining, NY (US); Sampath Purushothaman, Yorktown Heights, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 12/194,065

(22) Filed: Aug. 19, 2008

(65) Prior Publication Data
US 2010/0044826 A1    Feb. 25, 2010

(51) Int. Cl.
*H01L 21/30* (2006.01)
(52) U.S. Cl. . 438/455; 438/128; 438/622; 257/E21.502; 257/E21.503
(58) Field of Classification Search .................. 438/455, 438/622, 128; 257/E21.502, E21.503
See application file for complete search history.

(56) References Cited

U.S. PATENT DOCUMENTS

| | | | |
|---|---|---|---|
| 5,373,184 A | 12/1994 | Moslehi | |
| 5,426,072 A * | 6/1995 | Finnila | 438/107 |
| 5,844,839 A | 12/1998 | Smayling et al. | |
| 5,915,167 A | 6/1999 | Leedy | |
| 5,937,312 A | 8/1999 | Iyer et al. | |
| 6,130,422 A | 10/2000 | Bawolek et al. | |
| 6,762,076 B2 | 7/2004 | Kim et al. | |
| 7,151,009 B2 | 12/2006 | Kim et al. | |
| 7,566,632 B1 * | 7/2009 | Rothwell et al. | 438/455 |
| 2003/0036256 A1 | 2/2003 | Efland et al. | |
| 2005/0121711 A1 | 6/2005 | Pogge et al. | |
| 2006/0057836 A1 | 3/2006 | Nagarajan et al. | |
| 2007/0111386 A1 | 5/2007 | Kim et al. | |
| 2007/0287224 A1 | 12/2007 | Alam et al. | |
| 2008/0185103 A1 | 8/2008 | Bornstein et al. | |
| 2010/0047964 A1 | 2/2010 | Farooq | |
| 2010/0314711 A1 | 12/2010 | Farooq | |

OTHER PUBLICATIONS

Non-Final Office Action dated Apr. 1, 2011 for U.S. Appl. No. 12/194,211, filed Aug. 19, 2008.
International Search Report and Written Opinion dated Sep. 25, 2009 for PCT/US09/54333.

* cited by examiner

*Primary Examiner* — Long Tran
(74) *Attorney, Agent, or Firm* — Stephen Bongini; Fleit Gibbons Gutman Bongini & Bianco PL

(57) ABSTRACT

A method is provided for fabricating a 3D integrated circuit structure. According to the method, a first active circuitry layer wafer is provided. The first active circuitry layer wafer comprises a P+ portion covered by a P− layer, and the P− layer includes active circuitry. The first active circuitry layer wafer is bonded face down to an interface wafer that includes a first wiring layer, and then the P+ portion of the first active circuitry layer wafer is selectively removed with respect to the P− layer of the first active circuitry layer wafer. Next, a wiring layer is fabricated on the backside of the P− layer. Also provided are a tangible computer readable medium encoded with a program for fabricating a 3D integrated circuit structure, and a 3D integrated circuit structure.

18 Claims, 8 Drawing Sheets

3D INTEGRATED CIRCUIT DEVICE FABRICATION WITH PRECISELY CONTROLLABLE SUBSTRATE REMOVAL

CROSS REFERENCE TO RELATED APPLICATIONS

This application is related to application "3D Integrated Circuit Device Fabrication Using Interface Wafer As Permanent Carrier," Ser. No. 12/194,198, now pending, and application "3D Integrated Circuit Device Having Lower-Cost Active Circuitry Layers Stacked Before Higher-Cost Active Circuitry Layer," Ser. No. 12/194,211, now pending, which were filed on the same day as the present application and commonly assigned therewith to International Business Machines Corporation. These related applications are incorporated herein by reference in their entirety.

FIELD OF THE INVENTION

The present invention generally relates to the field of integrated circuits, and more particularly relates to the fabrication of three-dimensional (3D) integrated circuit devices.

BACKGROUND OF THE INVENTION

Three-dimensional (3D) integrated circuit devices are experiencing extremely active development in the industry. One problem experienced in the fabrication of 3D integrated circuit devices is that general purpose substrate thinning techniques do not allow the final substrate to be produced with a controlled thickness that is thin enough to allow high-density through-silicon vias with reasonable aspect ratios to be realized. One known technique for overcoming this problem is utilizing a buried oxide layer (BOX) as the etch stop. However, this technique only works for silicon-on-insulator (SOI) wafers. Further, even with an SOI wafer, this technique does not work for SOI circuits having structures that extend below the buried oxide, such as an embedded DRAM (e-DRAM) trench.

Another known technique for overcoming this problem is utilizing a double buried oxide layer (double-BOX) structure. However, this technique greatly increases the manufacturing cost. Further, like the single buried oxide layer structure solution, the double-BOX technique requires protection of the substrate from the other wafer. Such protection is required because, while the SOI wafer acts as an etch stop, it does not provide selectivity between the different substrates.

Yet another known technique for overcoming this problem is to not use an etch stop but to perform "blind" thinning. However, this technique does not allow the wafers to be thinned aggressively and creates uniformity problems. Further, for integrated circuits that require a high density of 3D vias, this technique also forces the use of high aspect ratio vias that cannot be filled with copper. Instead, tungsten has to be used for the vias, which has three times higher resistivity than copper.

Another problem experienced in the fabrication of 3D integrated circuit devices is that stacking three or more layers to create a multi-layer stack leads to yield loss. One technique that attempts to overcome this problem is to stack layers through bonding to temporary handle wafers. However, the use of such a temporary handle wafer (e.g., a glass wafer) induces overlay distortions that degrade the alignment overlay between the wafers. That is, this technique does not allow high-precision optical alignment in subsequent lithographic steps. Without high-precision optical alignment, the via density is degraded and large capture pads with high parasitic capacitances must be used. Further, the use of such bonding to temporary handle wafers does allow flexibility in the way the wafers are stacked.

Another technique that attempts to overcome this problem is to simply use a direct face-to-face joining of the wafers. However, such direct face-to-face joining is problematic because the bottom wafer (which usually is a logic wafer) must then be used as the handle wafer throughout the stacking process. While this may be acceptable in the fabrication of a two layer stack, for a multi-layer (i.e., three or more layer) stack this means that the logic wafer must go through many bonding and thinning steps. This increases the probability of catastrophic failure and loss of the entire integrated circuit, including the logic wafer that is often the most expensive wafer in the stack.

SUMMARY OF THE INVENTION

One embodiment of the present invention provides a method for fabricating a 3D integrated circuit structure. According to the method, a first active circuitry layer wafer is provided. The first active circuitry layer wafer comprises a P+ portion covered by a P− layer, and the P− layer includes active circuitry. The first active circuitry layer wafer is bonded face down to an interface wafer that includes a first wiring layer, and then the P+ portion of the first active circuitry layer wafer is selectively removed with respect to the P− layer of the first active circuitry layer wafer. Next, a wiring layer is fabricated on the backside of the P− layer.

Another embodiment of the present invention provides a 3D integrated circuit structure that includes an interface wafer, a first active circuitry layer wafer comprising a P− layer that includes active circuitry, a second wiring layer on the backside of the P− layer, and a second active circuitry layer wafer comprising a P+ portion covered by a P− layer. The interface wafer includes a first wiring layer, and the first active circuitry layer wafer is bonded face down to the interface wafer. The P− layer of the second active circuitry layer wafer includes active circuitry, and the second active circuitry layer wafer is bonded face down to the second wiring layer.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION

Preferred embodiments of the present invention will be described in detail hereinbelow with reference to the attached drawings.

Embodiments of the present invention allow precisely controllable substrate removal during three-dimensional (3D) integrated circuit device fabrication by utilizing a P+/P− substrate. The P+/P− substrate is a P+ wafer that has a P− top active layer. In one exemplary embodiment, the P− top active layer is grown epitaxially on a P+ wafer and has a thickness of between about 5 and 20 microns. The P+ wafer and P− top active layer of the P+/P− substrate allow controllable substrate removal down to very thin layers. Thus, the present invention overcomes the problem of a lack of controllable substrate thinning that is present in the known and previously proposed substrate thinning techniques for 3D integrated circuits. The controllability of substrate removal in the present invention allows low aspect ratio vias that can be filled with copper, so as to present low resistivity. Additionally, in embodiments of the present invention, a general purpose etch stop layer is provided that is cost effective and robust.

Figure 1:
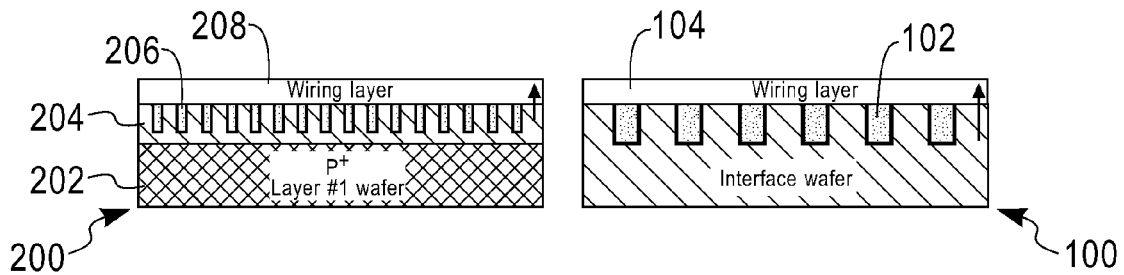
FIGS. 1 to 11 are cross-sectional views of a process for fabricating a three-dimensional integrated circuit device according to one embodiment of the present invention.

FIGS. 1 to 11 illustrate a process for fabricating a three-dimensional integrated circuit device according to one embodiment of the present invention. As shown in FIG. 1, the process starts with an interface wafer 100, which will be the interface between the stacked active circuitry layers and a package in the completed integrated circuit. In particular, the exposed surface of the interface wafer 100 will carry the C4 (controlled collapse chip connection) solder bumps in the completed integrated circuit. These C4 (or flip-chip) solder bumps are used to attach the integrated circuit to the package (e.g., a resin or ceramic module). The interface wafer 100 is a substrate made of a material that is not soluble in the etchants that are utilized in the subsequent substrate removal steps (i.e., a material that is not soluble in etchants that selectively etch P+ layers with respect to P− layers).

In this embodiment, the interface wafer is not formed from a P+ substrate, so it is impervious to the etching that removes the substrates of the wafers of the active circuitry layers of the stack. The interface wafer 100 is a silicon substrate that has through-silicon vias 102 at the same pitch as the package. Further, in this embodiment, the through-silicon vias are filled with tungsten metal. In further embodiments, the through-silicon vias are filled with other metallurgies, such as copper. The through-silicon vias of the interface wafer 100 do not need to be made of the same material as the through-silicon vias in the other layers of the stack. The interface wafer 100 also has a wiring layer 104 that distributes signals and power to the stacked layers of the integrated circuit. In this embodiment, the interface wafer 100 is transparent to infrared radiation.

Additionally, a first active circuitry layer wafer 200 is provided. The first active circuitry layer wafer 200 is formed with a P+/P− silicon substrate, which is a P+ wafer 202 that has a P− top active layer 204. In this embodiment, the P− top active layer 204 is grown epitaxially on a P+ wafer and has a thickness of between about 5 and 20 microns. Further, in this embodiment the P+ wafer is a boron-doped wafer with a doping concentration in the range of about $1\times10^{18}$ cm$^{-3}$ to $3\times10^{20}$ cm$^{-3}$, and the P− epitaxial layer has a doping concentration of less than about $1\times10^{18}$ cm$^{-3}$. In further embodiments, the P− epitaxial layer is not-intentionally-doped, or doped N-type with a concentration of less than about $1\times10^{18}$ cm$^{-3}$.

Through-silicon vias 206 are etched into the P− top active circuitry layer 204 so as to end near the P+ wafer 202. In further embodiments, the vias 206 pass through the surface of the P+ wafer 202. Active circuitry (i.e., active components such as transistors) and one or more wiring levels 208 are formed at the top surface of the first active circuitry layer wafer 200.

Figure 2:
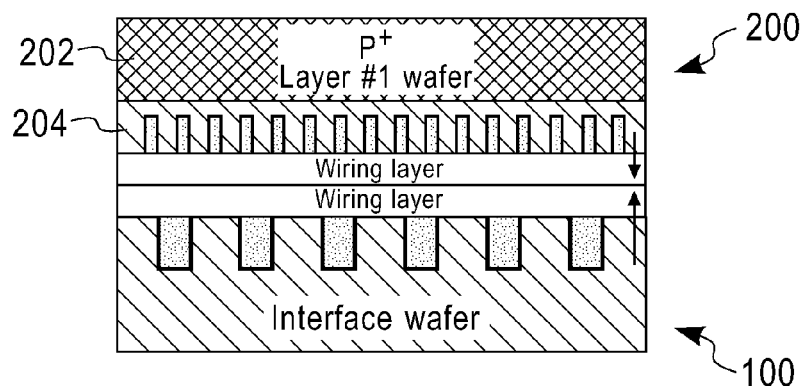

Next, as shown in FIG. 2, the first active circuitry layer wafer 200 is aligned face down to the interface wafer 100. This face-to-face alignment using two silicon wafers allows for higher-precision alignment compared to the case where one of the wafers utilizes a temporary handle wafer (e.g., of glass). The first active circuitry layer wafer 200 is bonded to the interface wafer 100. In this embodiment, copper-copper or a combination of copper-copper and adhesive bonding (e.g., using a polymer adhesive) is utilized. In further embodiments, other metallurgies (such as a copper alloy or a nickel-gold alloy) are utilized.

Figure 3:
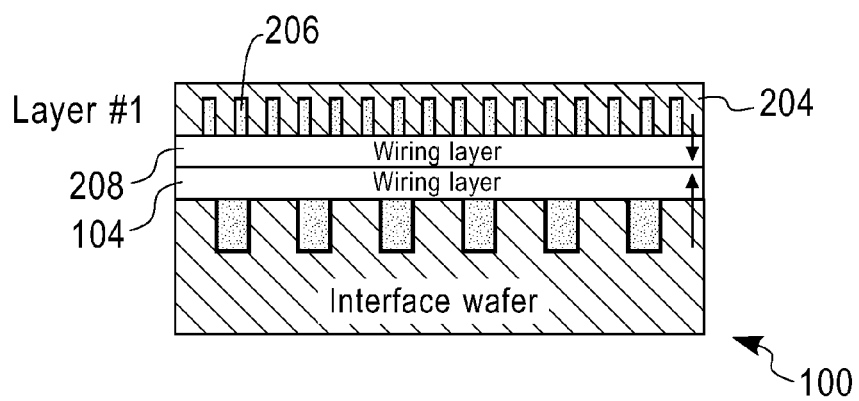

The P+ layer 202 of the first active circuitry layer wafer 200 is then selectively removed, as shown in FIG. 3. In this embodiment, a series of non-selective substrate thinning processes are first utilized (e.g., wafer grinding and polishing), and then wet chemical etching is utilized to remove the remaining P+ layer 202 selectively with respect to the P− layer 204. The final removal of the P+ layer 202 of the first active circuitry layer wafer 200 is performed using a selective etchant, such as HNA (hydrofluoric acid/nitric acid/acetic acid). Because the bulk of the interface wafer 100 is not soluble in this selective etchant, the process is very robust. Additionally, in this embodiment the interface wafer 100 is made from a lightly doped N− or P− silicon in order to allow infrared (IR) alignment to be performed. In other embodiments, the interface wafer 100 is also a P+ silicon substrate.

This selective removal of the P+ layer does not substantially affect the P− epitaxial layer 204, the active circuitry and wiring levels 104 and 208, or the interface wafer 100 that remain. Thus, the use of the P+/P− substrate allows the P+ layer to be selectively removed, so that the wafer is controllably thinned to the thickness of the P− layer, which can be made very thin (e.g., about 5-20 microns thick).

Figure 4:
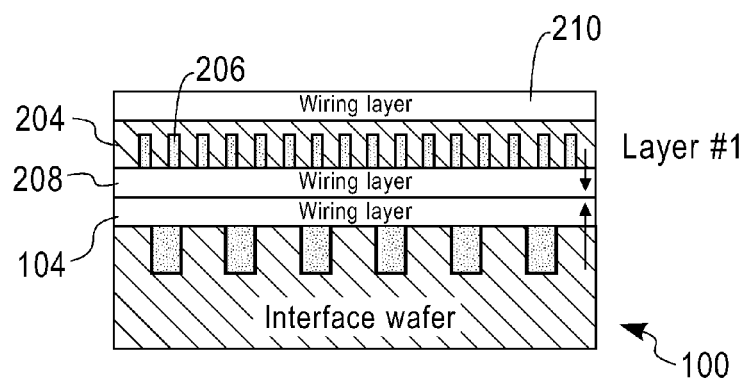

Next, in this embodiment, an etch back (e.g., using reactive ion etching) is performed in order to expose the top portions of the vias 206 in the P− layer 204. In other embodiments in which the vias 206 pass into the P+ layer 202, such an etch is not needed as the top portions of the vias are already exposed after the selective removal of the P+ layer. A wiring layer 210 having insulation and one or more back end of line (BEOL) metallization layers coupled to the vias 206 is then patterned onto the backside of the P− layer 204, as shown in FIG. 4. In this embodiment, each metallization layer of the wiring layer 210 is formed by depositing a dielectric layer, etching the dielectric layer, and depositing metal in the etched areas.

Figure 5:
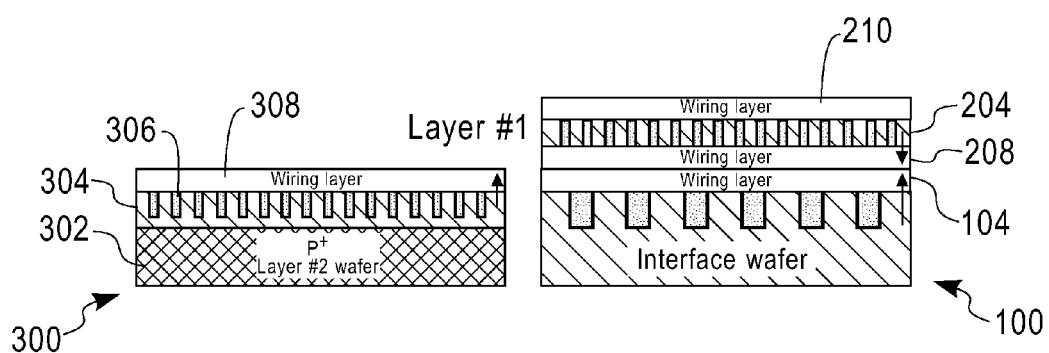

These steps are then repeated any number of times to create a multi-layer stack on the interface wafer 100. For example, in the illustrated embodiment these steps are repeated once more to create a second active circuitry layer. More specifically, a second active circuitry layer wafer 300 is provided, as shown in FIG. 5. The second active circuitry layer wafer 300 is also formed with a P+/P− silicon substrate, which is a P+ wafer 302 that has a P− top active circuitry layer 304. In this embodiment, the P− top active circuitry layer 304 is grown epitaxially and has a thickness of between about 5 and 20 microns. Through-silicon vias 306 are etched into the P− top active circuitry layer 304 so as to end near the P+ wafer 302, and active circuitry and one or more wiring levels 308 are formed at the top surface of the second active circuitry layer wafer 300.

Figure 6:
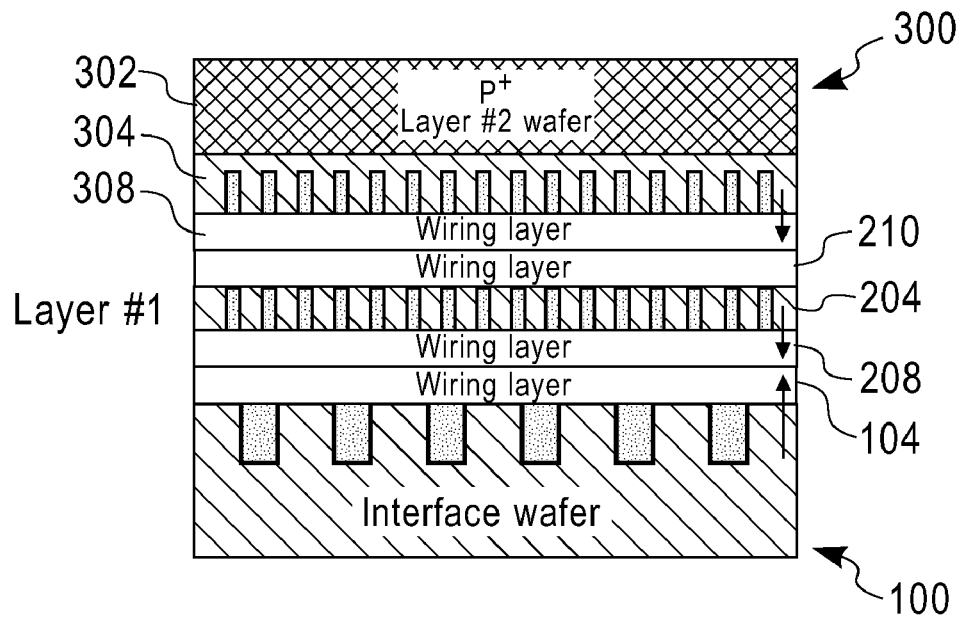

Next, as shown in FIG. 6, the second active circuitry layer wafer 300 is aligned face down to the wiring layer 210 on the first P− layer 204 attached to the interface wafer 100. This face-to-face alignment using two silicon wafers allows for higher-precision alignment compared to the case where one of the wafers utilizes a temporary handle wafer (e.g., of glass). The second active circuitry layer wafer 300 is bonded to the wiring layer 210 using copper-copper or a combination of copper-copper and adhesive bonding. In further embodiments, other metallurgies (such as a copper alloy or a nickel-gold alloy) are utilized.

Figure 7:
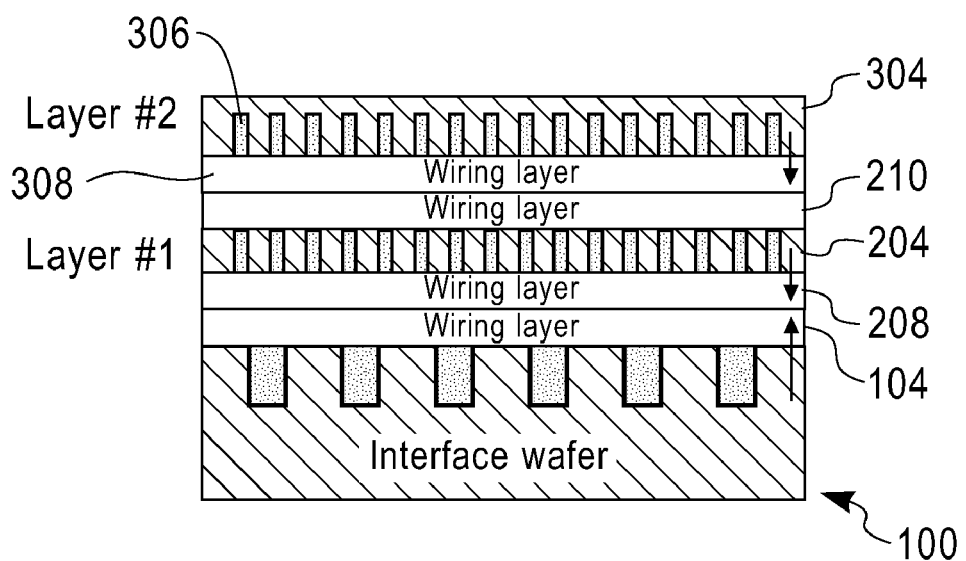

The P+ layer 302 of the second active circuitry layer wafer 300 is then selectively removed, as shown in FIG. 7. In this embodiment, a series of non-selective substrate thinning processes are first utilized (e.g., wafer grinding and polishing), and then a wet chemical etching is utilized to remove the remaining P+ layer 302 of the second active circuitry layer wafer 300 selectively with respect to the P− layer 304 of the second active circuitry layer wafer 300. This selective removal of the P+ layer 302 of the second active circuitry layer wafer 300 does not substantially affect the P− layers 204 and 304, the active circuitry and wiring levels 104, 208, 210, and 308, or the interface wafer 100 that remain. Thus, the interface wafer 100 is robust against multiple substrate removal etches for removing the P+ layers of all of the active circuitry layer wafers that are used to create the multi-layer stack.

Figure 8:
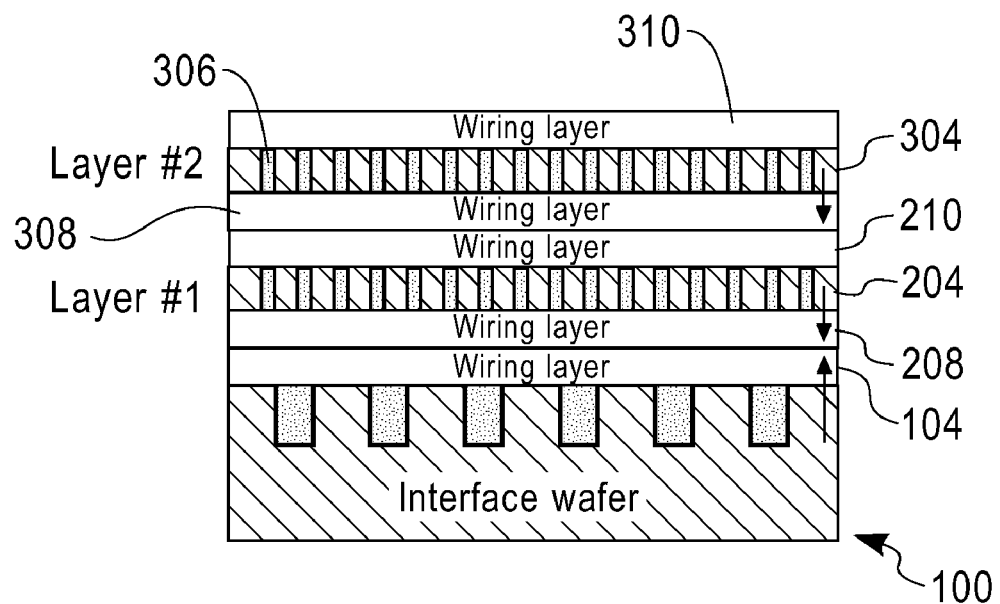

An etch back is then performed in order to expose the top portions of the vias 306 in the second P− layer 304. A wiring layer 310 having insulation and one or more BEOL metallization layers coupled to the vias 306 is then patterned onto the backside of the second P− layer 304, as shown in FIG. 8.

Figure 9:
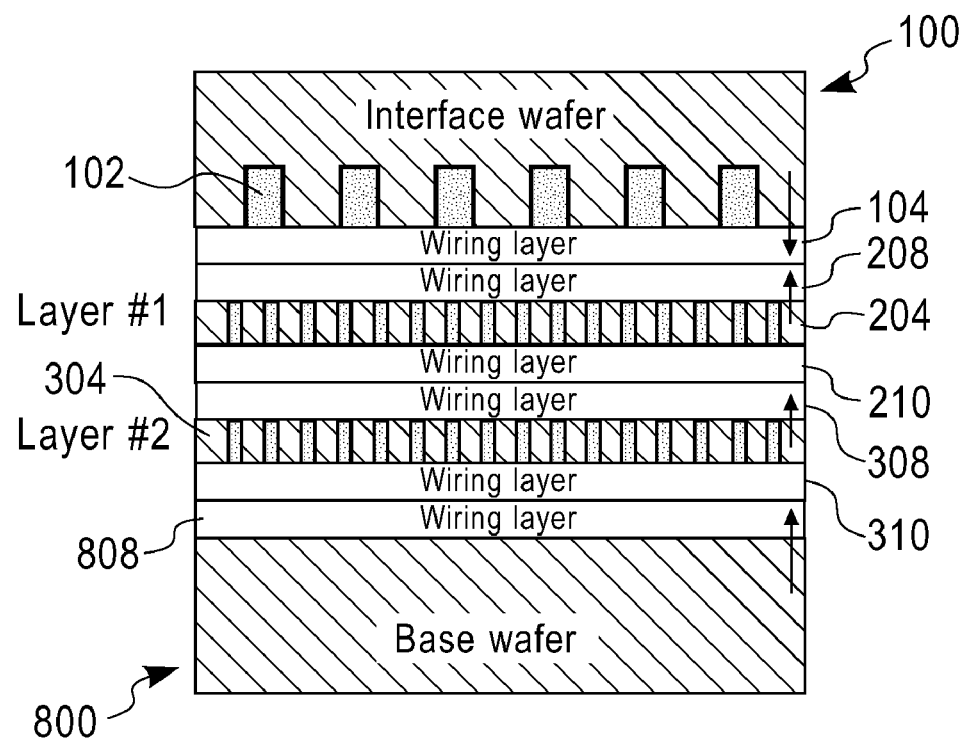

After the desired number of active circuitry layers are bonded to the interface layer in this manner, the resulting structure is attached to a base wafer 800, as shown in FIG. 9. The base wafer 800 of this embodiment is made of bulk silicon or SOI and is topped by a wiring layer 808 having insulation and one or more BEOL metallization layers. In this embodiment, the base wafer 800 does not have through-silicon vias. In some embodiments, the base wafer includes active circuitry (e.g., transistors) and/or passive circuit elements (e.g., resistors and capacitors). The interface layer 100 and the stack of active circuitry layers attached to it are aligned face down to the base wafer. Thus, because they have been "flipped" twice in this embodiment, all of the active circuitry layers that were previously stacked on the interface wafer 100 are now face up with respect to the base wafer 800, as shown by the arrows in FIG. 9.

Figure 10:
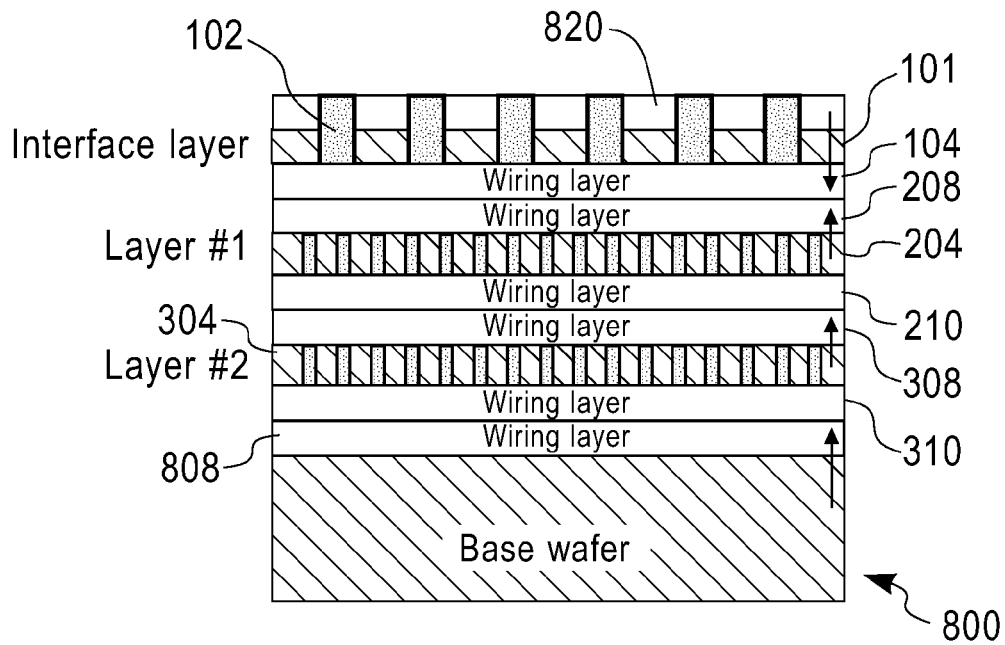

The top wiring layer 310 of the multi-layer stack is then bonded to the base wafer 800. In this embodiment, copper-copper or a combination of copper-copper and adhesive bonding (e.g., using a polymer adhesive) is utilized. In further embodiments, other metallurgies (such as a copper alloy or a nickel-gold alloy) are utilized. The interface wafer 100 is then thinned. In this embodiment, this thinning is achieved in two steps. First, a combination of wafer grinding and polishing are performed to thin the interface wafer to above the vias 102 in the interface wafer 100. Then, the interface wafer 100 is further thinned through a dry etch (e.g., using reactive ion etching) so as to form an interface layer 101 that exposes the top portions of the vias 102, as shown in FIG. 10. A backside dielectric layer 820 is then deposited onto the backside of the interface layer 101.

Figure 11:
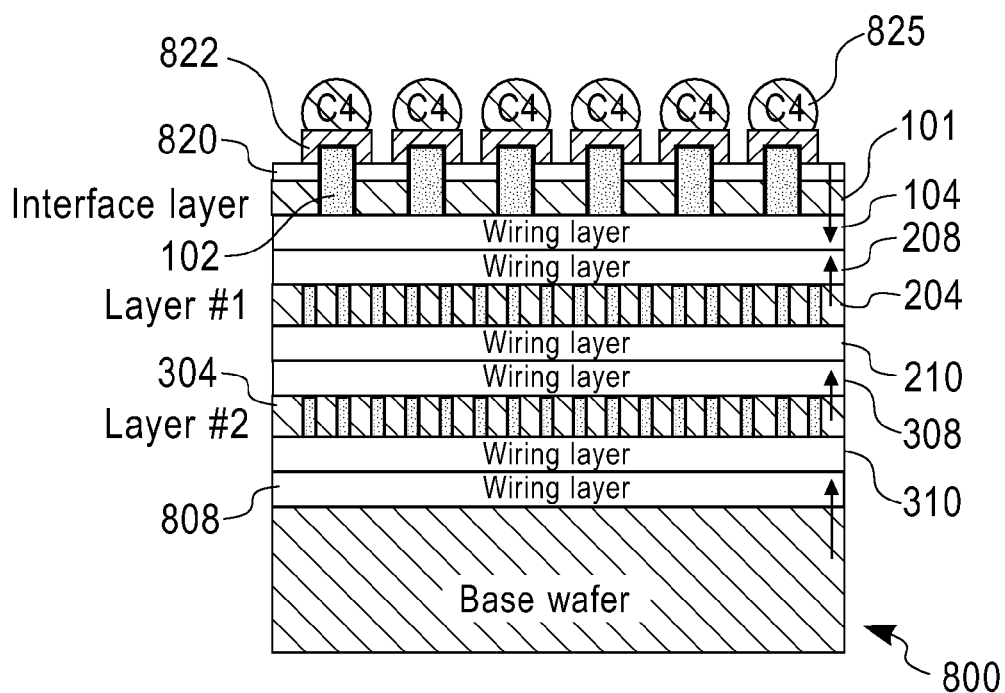

As shown in FIG. 11, the backside dielectric layer 820 is then polished and/or etched, and contact metallizations 822 are deposited onto the vias 102 of the interface layer 101. In this embodiment, a simple ball-limiting metallization is deposited on the vias so as to allow deposition of C4 solder bumps. In other embodiments, more complex dielectric and metallization layers are formed. The C4 solder bumps 825 are then deposited onto the contact metallizations 822 to complete the 3D integrated circuit structure. In this embodiment, the C4 solder bumps are on the order of 100 μm in diameter and 200 μm or less in pitch. These C4 (or flip-chip) solder bumps are then used to bond the integrated circuit to the package (e.g., a resin or ceramic module).

The exemplary process described above is only meant to illustrate the principles of the present invention. By simply varying the number, types, and order of layers that are stacked on the interface wafer, many different 3D integrated circuit structures can be produced. For example, while the exemplary process described above produces a structure having a 1+2+1 stack (1 base wafer, 2 active circuitry layers, and 1 interface layer), a structure having a 1+N+1 stack can be created by simply repeating the active circuitry layer stacking process N times as described above. In the 1+N+1 stack structure, additional active circuitry layers (each analogous to the one formed by layers 210, 204, and 208) are stacked between layer 210 of the first active circuitry layer and layer 308 of the last ($N^{th}$) active circuitry layer in the structure of FIG. 11 (see, for example, FIG. 12).

Similarly, a structure having a 1+1+1 stack can be created by only performing the active circuitry layer stacking process one time. In the 1+1+1 stack structure, the second active circuitry layer (the one formed by layers 310, 304, and 308) is absent from the structure of FIG. 11. Thus, the process of the present invention for stacking multiple active circuitry layers on top of a base wafer can also be used in a consistent manner to stack only one active circuitry layer on a base wafer.

Figure 12:
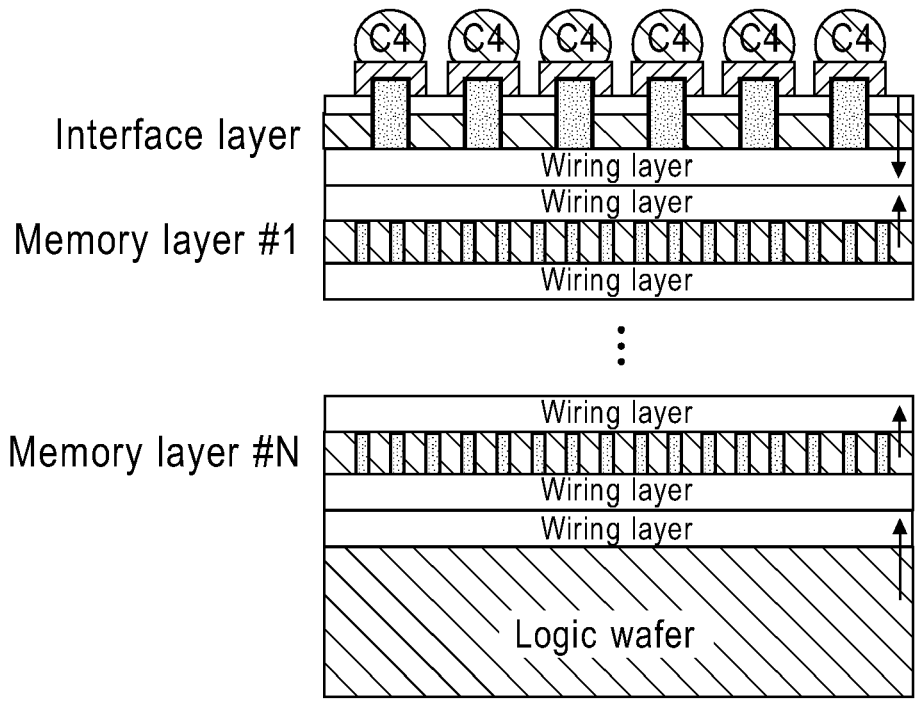
FIG. 12 shows a 3D integrated circuit structure having a logic layer-active circuitry layers-interface layer stack structure according to one embodiment of the present invention.

In further embodiments, a logic wafer (i.e., a wafer with logic circuitry) is used as the base wafer (i.e., the base wafer includes logic circuitry). For example, FIG. 12 shows a 3D integrated circuit structure having a logic wafer-active circuitry layers-interface layer stack structure according to one embodiment of the present invention. This exemplary embodiment has an interface layer that is stacked on top of N active circuitry layers, which are memory layers, that are in turn stacked on top of a logic wafer. The memory layers are any type of memory, such as SRAM memory, e-DRAM memory, or a combination of the two. The logic wafer contains control and/or logic circuitry, such as a memory controller or a processor core. In another embodiment, the interface layer and only one active circuitry layer (e.g., memory layer) are stacked on top of the logic wafer.

Figure 13:
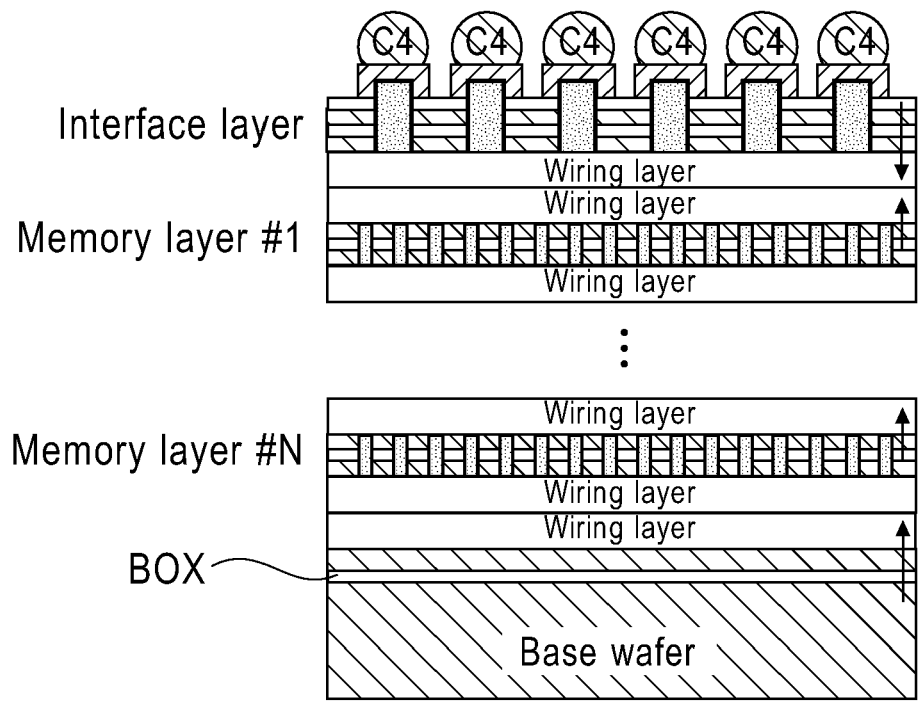
FIG. 13 shows a 3D integrated circuit structure in which all of the layers are SOI wafers in accordance with one embodiment of the present invention.

Additionally, one or more of the wafers used in the process described above can be a silicon-on-insulator (SOI) wafer. For example, FIG. 13 shows a 3D integrated circuit structure in which all of the layers are formed on SOI wafers in accordance with one embodiment of the present invention. In an alternative embodiment, the base wafer is an SOI substrate (as in FIG. 13), while the wafers for the active circuitry layers and the interface layer are bulk silicon wafers (as in FIG. 12). In yet another embodiment, the base wafer is an SOI substrate (as in FIG. 13), the wafers for the active circuitry layers include both an SOI wafer (as in FIG. 13) and a bulk silicon wafer (as in FIG. 12), and the wafer for the interface layer is either an SOI or bulk silicon wafer.

Figure 14:
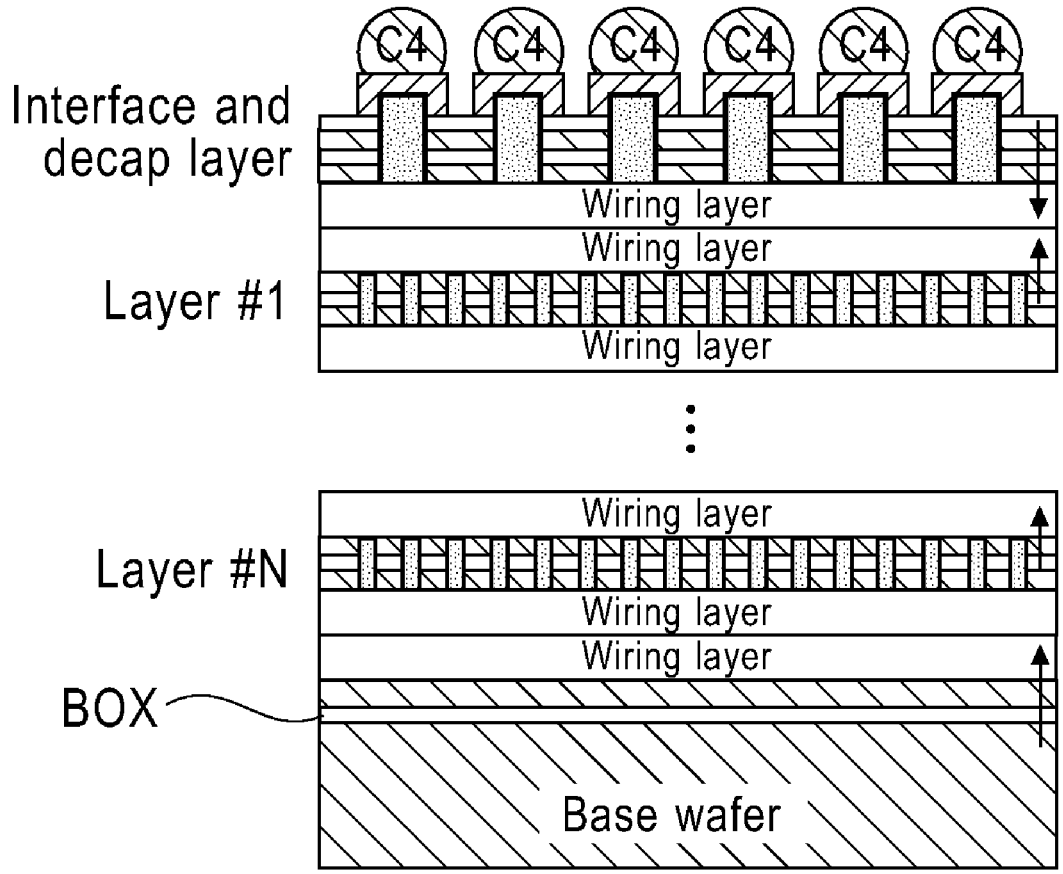
FIG. 14 shows a 3D integrated circuit structure having circuit elements in the interface layer of the stack structure according to one embodiment of the present invention.

FIG. 14 shows a 3D integrated circuit structure having circuit elements in the interface layer of the stack structure according to one embodiment of the present invention. In this embodiment, the interface layer includes additional functionality through the provision of active circuitry and/or passive circuit elements. For example, the interface layer can include a decoupling capacitor layer in order to stabilize the voltage grid. Alternatively or additionally, the interface layer can include voltage regulation circuitry formed by active transistors as well as passive elements such as decoupling capacitors.

Accordingly, embodiments of the present invention utilize a P+/P− substrate to fabricate a 3D integrated circuit device. This allows precisely controllable substrate removal down to very thin layers. Thus, the present invention overcomes the problem of a lack of controllable substrate thinning that is present in the known substrate thinning techniques for 3D integration. This allows low aspect ratio vias that can be filled with copper, so as to present low resistivity. Additionally, in embodiments of the present invention, a general purpose etch stop layer is provided that is cost effective and robust.

The embodiments of the present invention described above are meant to be illustrative of the principles of the present invention. These device fabrication processes are compatible with conventional semiconductor fabrication methodology, and thus various modifications and adaptations can be made by one of ordinary skill in the art. All such modifications still fall within the scope of the present invention. For example, the various layer thicknesses, material types, deposition techniques, and the like discussed above are not meant to be limiting.

Furthermore, some of the features of the examples of the present invention may be used to advantage without the corresponding use of other features. As such, the foregoing description should be considered as merely illustrative of the principles, teachings, examples and exemplary embodiments of the present invention, and not in limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Figure 15:
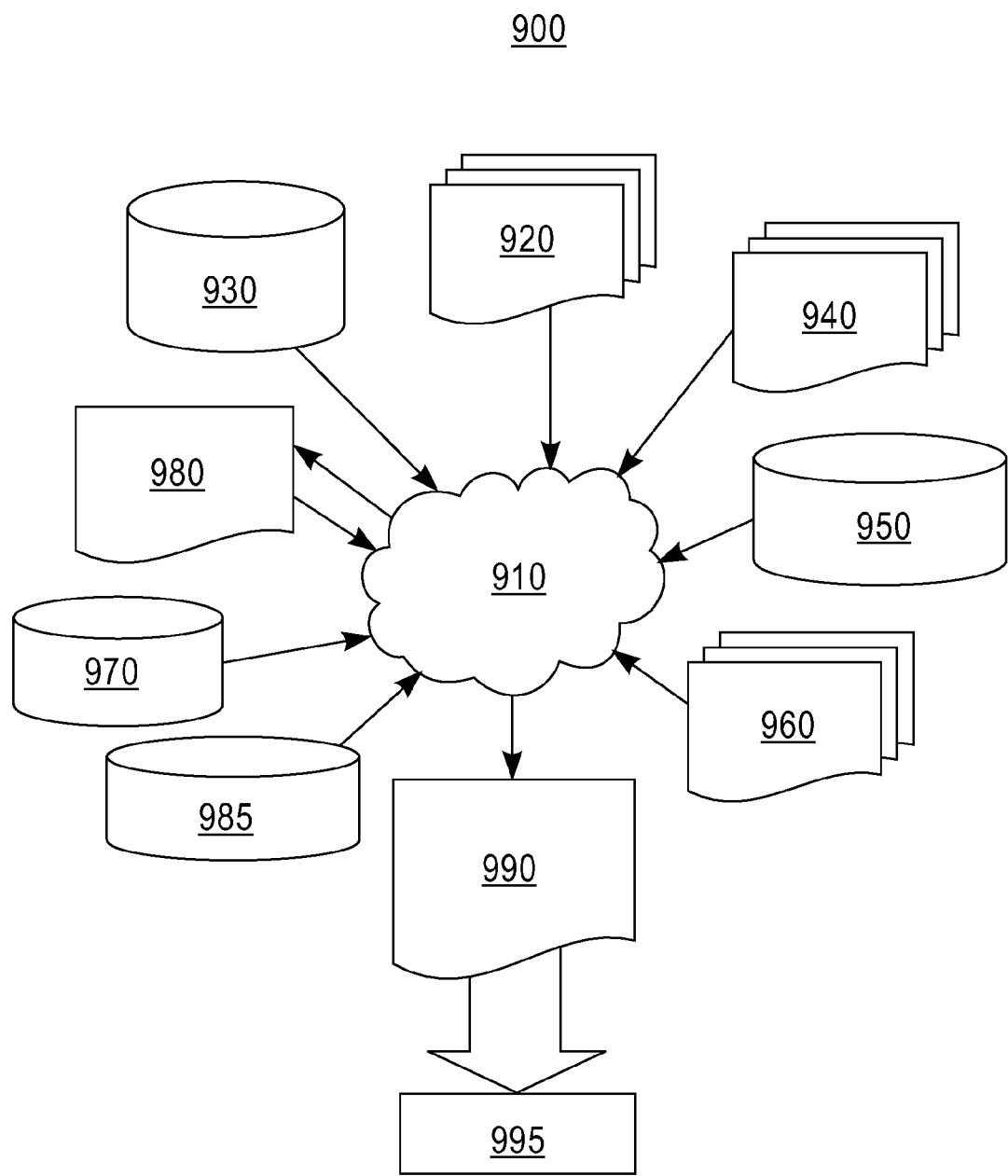
FIG. 15 is a flow diagram of a design process used in semiconductor design, manufacture, and/or test.

FIG. 15 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-14. In one embodiment, design structure 990 may comprise a compiled, executable HDL simulation model that functionally simulates the devices shown in FIGS. 1-14.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-14. Design structure 990 may then proceed to a stage 995 where, for example, design structure 990: proceeds to tape-out, is released to manufacturing, is released to a mask house, is sent to another design house, is sent back to the customer, etc.

What is claimed is:

1. A method for fabricating a 3D integrated circuit, the method comprising the steps of:

providing an interface wafer, the interface wafer including a first wiring layer and through-silicon vias;

providing a first active circuitry layer wafer comprising a P+ portion covered by a P− layer, the P− layer of the first active circuitry layer wafer including active circuitry and through-silicon vias;

fabricating a second wiring layer at a top surface of the first active circuitry layer wafer;

performing a high-precision face-to-face alignment of the first active circuitry layer wafer face down to the interface wafer;

bonding the second wiring layer of the first active circuitry layer wafer directly to the first wiring layer of the interface wafer;

after bonding the first active circuitry layer wafer to the interface wafer, selectively removing the P+ portion of the first active circuitry layer wafer with respect to the P− layer of the first active circuitry layer wafer;

after selectively removing the P+ portion of the first active circuitry layer wafer, fabricating a third wiring layer on the backside of the P− layer;

providing a second active circuitry layer wafer comprising a P+ portion covered by a P− layer, the P− layer of the second active circuitry layer wafer including active circuitry;

fabricating a fourth wiring layer at a top surface of the second active circuitry layer Wafer;

performing a high-precision face-to-face alignment of the second active circuitry layer wafer face down to the P− layer of the first active circuitry layer wafer;

bonding the fourth wiring layer of the second active circuitry layer wafer directly to the third wiring layer on the backside of the P− layer;

after bonding the second active circuitry layer wafer to the third wiring layer, selectively removing the P+ portion of the second active circuitry layer wafer with respect to the P− layer of the second active circuitry layer wafer;

after selectively removing the P+ portion of the second active circuitry layer wafer, fabricating a fifth wiring layer on the backside of the P− layer of the second active circuitry layer wafer;

providing a base wafer, the base wafer including a sixth wiring layer;

performing a high-precision face-to-face alignment of the P− layer of the second active circuitry layer wafer face down to the base wafer;

bonding the fifth wiring layer on the backside of the P− layer of the second active circuitry layer wafer directly to the sixth wiring layer of the base wafer; and after bonding the fifth wiring layer to the base wafer, thinning the interface wafer so as to form an interface layer, and forming metallizations comprising solder bumps on the interface layer, the solder bumps being coupled through the through-silicon vias in the interface layer to the first wiring layer, wherein the interface wafer is formed of a material that is not soluble in an etchant used in the selectively removing step to selectively etch the P+ portion of the first active circuitry layer wafer with respect to the P− layer of the first active circuitry layer wafer.

2. A method for fabricating a 3D integrated circuit structure, the method comprising the steps of:
providing a first active circuitry layer wafer comprising a P+ portion covered by a P− layer, the P− layer of the first active circuitry layer wafer including active circuitry;
fabricating a first wiring layer at a top surface of the first active circuitry layer wafer;
performing a high-precision face-to-face alignment of the first active circuitry layer wafer face down to an interface wafer that includes a second wiring layer;
bonding the first wiring layer of the first active circuitry layer wafer directly to the second wiring layer of the interface wafer;
after bonding the first active circuitry layer wafer to the interface wafer, selectively removing the P+ portion of the first active circuitry layer wafer with respect to the P− layer of the first active circuitry layer wafer; and
after selectively removing the P+ portion of the first active circuitry layer wafer, fabricating a third wiring layer directly on the backside of the P− layer.

3. The method of claim 2, further comprising the steps of:
providing a base wafer, the base wafer including a fourth wiring layer;
performing a high-precision face-to-face alignment of the P− layer of the first active circuitry layer wafer face down to the base wafer; and
bonding the third wiring layer on the backside of the P− layer of the first active circuitry layer wafer directly to the fourth wiring layer of the base wafer.

4. The method of claim 3, further comprising the step of:
after bonding the third wiring layer on the backside of the P− layer of the first active circuitry layer wafer to the base wafer, thinning the interface wafer so as to form an interface layer, and forming metallizations on the interface layer, the metallizations being coupled through vias in the interface layer to the second wiring layer.

5. The method of claim 3, wherein the base wafer includes logic circuitry.

6. The method of claim 2, wherein the interface wafer is formed of a material that is not soluble in an etchant used in the selectively removing step to selectively etch the P+ portion of the first active circuitry layer wafer with respect to the P− layer of the first active circuitry layer wafer.

7. The method of claim 2, wherein the first active circuitry layer wafer further comprises through-silicon vias.

8. The method of claim 2,
wherein the interface wafer comprises a lightly doped N− or P− silicon, and
the performing step comprises performing an infrared alignment.

9. The method of claim 2, wherein the performing step comprises performing a high-precision optical alignment.

10. The method of claim 9, wherein the bonding step comprises bonding the first wiring layer of the first active circuitry layer wafer directly to the second wiring layer of the interface wafer through at least one of copper-copper, copper alloy-copper alloy, and nickel-gold alloy-nickel-gold alloy bonding.

11. The method of claim 2, wherein the bonding step comprises utilizing metal-metal bonding to bond the first wiring layer of the first active circuitry layer wafer directly to the second wiring layer of the interface wafer.

12. The method of claim 2, wherein the providing step comprises the sub-steps of:

epitaxially growing the P− layer on the P+ portion of the first active circuitry layer wafer; and
fabricating active circuitry in the P− layer of the first active circuitry layer wafer.

13. The method of claim 2,
wherein the first active circuitry layer wafer is not a temporary handle wafer, and
in the bonding step, neither the first active circuitry layer wafer nor the interface wafer is attached to a temporary handle wafer.

14. The method of claim 2, wherein the first wiring layer of the first active circuitry layer wafer does not include large capture pads, and the second wiring layer of the interface wafer does not include large capture pads.

15. The method of claim 2, further comprising the steps of:
providing another active circuitry layer wafer comprising a P+ portion covered by a P− layer, the P− layer of the other active circuitry layer wafer including active circuitry;
fabricating a fourth wiring layer at a top surface of the other active circuitry layer wafer;
performing a high-precision face-to-face alignment of the other active circuitry layer wafer face down to the P− layer of the first active circuitry layer wafer;
bonding the fourth wiring layer of the other active circuitry layer wafer directly to the third wiring layer on the backside of the P− layer of the first active circuitry layer wafer;
after bonding the other active circuitry layer wafer, selectively removing the P+ portion of the other active circuitry layer wafer with respect to the P− layer of the other active circuitry layer wafer; and
after selectively removing the P+ portion of the other active circuitry layer wafer, fabricating another wiring layer directly on the backside of the P− layer of the other active circuitry layer wafer.

16. The method of claim 15, further comprising the steps of:
providing a base wafer, the base wafer including a base wafer wiring layer;
performing a high-precision face-to-face alignment of a P− layer of a final active circuitry layer wafer face down to the base wafer; and
bonding a wiring layer on a backside of the P− layer of the final active circuitry layer wafer directly to the base wafer wiring layer of the base wafer.

17. The method of claim 15, further comprising the steps of:
providing a further active circuitry layer wafer comprising a P+ portion covered by a P− layer, the P− layer of the further active circuitry layer wafer including active circuitry;
fabricating a further wiring layer at a top surface of the further active circuitry layer wafer;
performing a high-precision face-to-face alignment of the further active circuitry layer wafer face down to the P− layer of the previous active circuitry layer wafer;
bonding the further wiring layer of the further active circuitry layer wafer directly to the wiring layer on the backside of the P− layer of the previous active circuitry layer wafer;
after bonding the further active circuitry layer wafer, selectively removing the P+ portion of the further active circuitry layer wafer with respect to the P− layer of the further active circuitry layer wafer; and
after selectively removing the P+ portion of the further active circuitry layer wafer, fabricating another wiring layer directly on the backside of the P− layer of the further active circuitry layer wafer.

18. The method of claim 17, further comprising the step of: repeating N times the steps of providing a further active circuitry layer wafer, fabricating a further wiring layer, performing a high-precision face-to-face alignment, bonding the further wiring layer of the further active circuitry layer wafer, selectively removing the P+ portion of the further active circuitry layer wafer, and fabricating another wiring layer directly on the backside of the P− layer of the further active circuitry layer wafer.

* * * * *